United States Patent
Forrest et al.

(10) Patent No.: US 11,552,247 B2
(45) Date of Patent: Jan. 10, 2023

(54) ORGANIC VAPOR JET NOZZLE WITH SHUTTER

(71) Applicants: The Regents of the University of Michigan, Ann Arbor, MI (US); Trustees of Boston University, Boston, MA (US)

(72) Inventors: Stephen R. Forrest, Ann Arbor, MI (US); Jeffrey A. Horowitz, Ann Arbor, MI (US); David J. Bishop, Brookline, MA (US)

(73) Assignee: The Regents of the University of Michigan, Ann Arbor, MI (US)

( * ) Notice: Subject to any disclaimer, the term of this patent is extended or adjusted under 35 U.S.C. 154(b) by 115 days.

(21) Appl. No.: 16/821,416

(22) Filed: Mar. 17, 2020

(65) Prior Publication Data
US 2020/0303645 A1    Sep. 24, 2020

Related U.S. Application Data

(60) Provisional application No. 62/821,129, filed on Mar. 20, 2019.

(51) Int. Cl.
*H01L 29/08* (2006.01)
*H01L 51/00* (2006.01)
(Continued)

(52) U.S. Cl.
CPC .......... *H01L 51/0004* (2013.01); *B81B 7/008* (2013.01); *H01L 51/56* (2013.01); *H01L 51/5206* (2013.01); *H01L 51/5221* (2013.01)

(58) Field of Classification Search
CPC .................................................. H01L 51/0004
See application file for complete search history.

(56) References Cited

U.S. PATENT DOCUMENTS

| 4,769,292 A | 9/1988 | Tang |
| 5,247,190 A | 9/1993 | Friend |

(Continued)

FOREIGN PATENT DOCUMENTS

| EP | 1238981 | 9/2002 |
| JP | 2010135467 | 6/2010 |

(Continued)

OTHER PUBLICATIONS

Baldo et al., "Highly Efficient Phosphorescent Emission from Organic Electroluminescent Devices," Nature, vol. 395,151-154, (1998).

(Continued)

*Primary Examiner* — Caleb E Henry
(74) *Attorney, Agent, or Firm* — Riverside Law LLP (57) ABSTRACT

An organic vapor deposition device comprises a print head, comprising a source channel, in fluid communication with a flow of carrier gas and a quantity of organic source material configured to mix with the carrier gas, a nozzle having a deposition outlet, in fluid communication with the source channel, and a shutter configured at least to open and close the deposition outlet, wherein the print heat is configured to allow the flow of carrier gas and the organic source material exit the deposition outlet when the shutter is in an open position, and to prevent the flow of carrier gas and the organic source material from exiting the deposition outlet when the shutter is in a closed position. A method of manufacturing a device comprising an organic feature on a substrate is also described.

13 Claims, 9 Drawing Sheets

(51) Int. Cl.
  *H01L 51/56*   (2006.01)
  *B81B 7/00*   (2006.01)
  *H01L 51/52*   (2006.01)

(56) References Cited

U.S. PATENT DOCUMENTS

| | | | |
|---|---|---|---|
| 5,703,436 | A | 12/1997 | Forrest |
| 5,707,745 | A | 1/1998 | Forrest |
| 5,834,893 | A | 11/1998 | Bulovic |
| 5,844,363 | A | 12/1998 | Gu |
| 6,013,982 | A | 1/2000 | Thompson |
| 6,087,196 | A | 7/2000 | Sturm |
| 6,091,195 | A | 7/2000 | Forrest |
| 6,097,147 | A | 8/2000 | Baldo |
| 6,294,398 | B1 | 9/2001 | Kim |
| 6,303,238 | B1 | 10/2001 | Thompson |
| 6,337,102 | B1 | 1/2002 | Forrest |
| 6,468,819 | B1 | 10/2002 | Kim |
| 7,279,704 | B2 | 10/2007 | Walters |
| 7,431,968 | B1 | 10/2008 | Shtein |
| 7,968,146 | B2 | 6/2011 | Wagner |
| 2003/0230980 | A1 | 12/2003 | Forrest |
| 2004/0174116 | A1 | 9/2004 | Lu |
| 2006/0290741 | A1* | 12/2006 | Silverbrook ............... B41J 2/16 347/47 |
| 2008/0117258 | A1* | 5/2008 | Silverbrook ......... B41J 2/14427 347/47 |
| 2010/0097416 | A1* | 4/2010 | Yoo ..................... B41J 2/005 427/58 |
| 2010/0201749 | A1* | 8/2010 | Somekh ............... B41M 5/0047 347/56 |
| 2010/0245479 | A1* | 9/2010 | Forrest ................. B05C 5/0291 347/47 |
| 2013/0026452 | A1 | 1/2013 | Kottas |
| 2013/0119354 | A1 | 5/2013 | Ma |
| 2013/0208036 | A1* | 8/2013 | Forrest ................. B41J 11/008 347/8 |
| 2019/0221783 | A1* | 7/2019 | McGraw ................. H01L 51/56 |
| 2019/0232325 | A1* | 8/2019 | McGraw ................. B05C 5/0212 |
| 2019/0256968 | A1* | 8/2019 | Quinn ..................... C23C 14/12 |
| 2019/0386257 | A1* | 12/2019 | Quinn ................. H01L 51/0005 |

FOREIGN PATENT DOCUMENTS

| | | |
|---|---|---|
| WO | 2004111066 | 12/2004 |
| WO | 2008044723 | 4/2008 |
| WO | 2008057394 | 5/2008 |
| WO | 2010011390 | 1/2010 |
| WO | 2010111175 | 9/2010 |

OTHER PUBLICATIONS

Baldo et al., "Very high-efficiency green organic light-emitting devices based on electrophosphorescence," Appl. Phys. Lett., vol. 75, No. 3, 4-6 (1999).

* cited by examiner

ORGANIC VAPOR JET NOZZLE WITH SHUTTER

CROSS-REFERENCE TO RELATED APPLICATIONS

This application claims priority to U.S. Provisional Patent Application No. 62/821,129, filed on Mar. 20, 2019, incorporated herein by reference in its entirety.

STATEMENT REGARDING FEDERALLY SPONSORED RESEARCH OR DEVELOPMENT

This invention was made with government support under Grant No. EEC1647837 awarded by the National Science Foundation. The government has certain rights in the invention.

FIELD OF THE INVENTION

The present disclosure relates to an organic vapor jet nozzle for fabricating organic light emitting diodes, and devices including the same.

BACKGROUND OF THE INVENTION

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

In one aspect, an organic vapor deposition device comprises a print head, comprising a source channel, in fluid communication with a flow of carrier gas and a quantity of organic source material configured to mix with the carrier gas, a nozzle having a deposition outlet, in fluid communication with the source channel, and a shutter configured at least to open and close the deposition outlet, wherein the print heat is configured to allow the flow of carrier gas and the organic source material exit the deposition outlet when the shutter is in an open position, and to prevent the flow of carrier gas and the organic source material from exiting the deposition outlet when the shutter is in a closed position.

In one embodiment, the shutter is a MEMS shutter. In one embodiment, the MEMS shutter comprises first and second fixed electrodes and a third movable electrode positioned between the first and the second electrodes, wherein the third electrode includes an aperture that is in fluid communication with the deposition outlet when the shutter is in an open position. In one embodiment, the MEMS shutter is electrostatically actuated. In one embodiment, the print head further comprises a dilution channel in fluid communication with the source channel, and configured to provide a dilution flow to be combined with the source flow. In one embodiment, the print head further comprises an exhaust channel separate from the deposition outlet in fluid communication with the source channel.

In one embodiment, when the shutter is in the closed position, the source flow flows through the exhaust channel. In one embodiment, the device further comprises a substrate holder positioned opposite the deposition outlet, configured to position a substrate such that when the shutter is in the open position, the organic source material is deposited on the substrate. In one embodiment, the device further comprises at least one optical sensor configured to gather data about a deposition pattern of the deposited organic source material. In one embodiment, the substrate holder is cooled. In one embodiment, the substrate holder is configured to move in at least two dimensions in response to control signals from a controller. In one embodiment, the substrate holder is configured to move in at least three dimensions. In one embodiment, the print head and the substrate holder are positioned inside a vacuum chamber.

In one embodiment, the device comprises a plurality of print heads. In one embodiment, each of the plurality of print heads is in fluid communication with a different quantity of organic source material. In one embodiment, all of the plurality of print heads are in fluid communication with the same flow of carrier gas. In one embodiment, the nozzle is selected from the group consisting of an S-C nozzle, a C-R nozzle, a C-T nozzle, and a C-D nozzle. In one embodiment, the shutter is positioned at the deposition outlet.

In another aspect, a method of manufacturing a device comprising an organic feature on a substrate, comprising the steps of providing a source flow comprising a carrier gas and an organic source material into a source channel, directing the source flow toward a nozzle having a deposition aperture in fluid communication with the source channel, opening a shutter positioned at the deposition aperture, thereby directing a vapor jet of the source flow toward a substrate, depositing a quantity of organic source material on the substrate to form an organic feature, and closing the shutter, obstructing the vapor jet.

In one embodiment, the shutter is a MEMS shutter, and further comprising the step of electrostatically actuating the MEMS shutter. In one embodiment, the method further comprises the step of providing a dilution flow of carrier gas into the source flow from a dilution channel. In one embodiment, the method further comprises the step of expelling an amount of the source flow from an exhaust channel separate from the deposition aperture. In one embodiment, the method further comprises the steps of measuring a parameter of the organic feature with an optical sensor, receiving the parameter at a controller communicatively connected to the optical sensor, and adjusting a setting of a component based on the received parameter.

In one embodiment, the parameter is reflected intensity. In one embodiment, the component is the shutter and the setting is an opening time. In one embodiment, the component is a valve in fluid communication with the source flow and the setting is an opening amount. In one embodiment, the method further comprises the steps of moving the substrate in at least one axis, and depositing a second quantity of the organic material on the substrate to form a second organic feature.

In another aspect, a device produced by the methods disclosed herein comprises a substrate, an anode, a cathode, and an organic feature disposed between the anode and the cathode.

BRIEF DESCRIPTION OF THE DRAWINGS

The foregoing purposes and features, as well as other purposes and features, will become apparent with reference to the description and accompanying figures below, which are included to provide an understanding of the invention and constitute a part of the specification, in which like numerals represent like elements, and in which.

DETAILED DESCRIPTION

It is to be understood that the figures and descriptions of the present disclosure have been simplified to illustrate elements that are relevant for a clear understanding of the present disclosure, while eliminating, for the purpose of clarity, many other elements found in related systems and methods. Those of ordinary skill in the art may recognize that other elements and/or steps are desirable and/or required in implementing the present disclosure. However, because such elements and steps are well known in the art, and because they do not facilitate a better understanding of the present disclosure, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this disclosure belongs. Although any methods and materials similar or equivalent to those described herein can be used in the practice or testing of the present disclosure, exemplary methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

Throughout this disclosure, various aspects can be presented in a range format. It should be understood that the description in range format is merely for convenience and brevity and should not be construed as an inflexible limitation on the scope of the disclosure. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, 6 and any whole and partial increments therebetween. This applies regardless of the breadth of the range.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In general, the various layers of OLEDs and similar devices described herein may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Organic vapor jet printing is designed to print micron-size features of organic electronic materials. A shortcoming of the technology is that you cannot rapidly switch the beam of molecules off. This is done by turning off the carrier gas flow. But this can take minutes to hours to completely shut down the effusion of molecules, causing them to deposit in unwanted regions of the substrate. In RGB displays or lighting, this is not necessarily a shortcoming since the writing of the emission zones of molecules can be done in stripes, with the definition of the pixels done by writing over exposed metal pads connected to the pixel electronic backplane transistors.

However, far more flexibility in printing patterns can be had for OLEDs, solar cells and OPVs if a 2D, highly focused pattern can be achieved. In this disclosure, a MEMS shutter is described combined with exhaust relief within the nozzle head, to rapidly switch (in milliseconds) the flow of materials. The shutter is electrostatically activated and can cut off the flow in milliseconds, for example in a time between 1 ms and 100 ms, or between 1 ms and 50 ms, or between 1 ms and 20 ms, or between 1 ms and 10 ms, thus printing very focused patterns at a rapid rate. The spot size is limited by the nozzle geometry and nozzle-to-substrate distance: factors well understood in OVJP. Pattern sizes of ~1 µm$^2$ are possible using this method, and residence times of 1 ms/pixel will ultimately limit the speed of pixel deposition. Thus, a MEMS nozzle head with an array of 3 (RG+B)× 3000 shutters and nozzles can in principle print 3000 pixels/ s, delivering a display of 3,000,000 pixels in 1000 s (~15 min). Faster speeds can be achieved using recent developments in rapid growth by OVPD and OVJP.

Figure 1A:
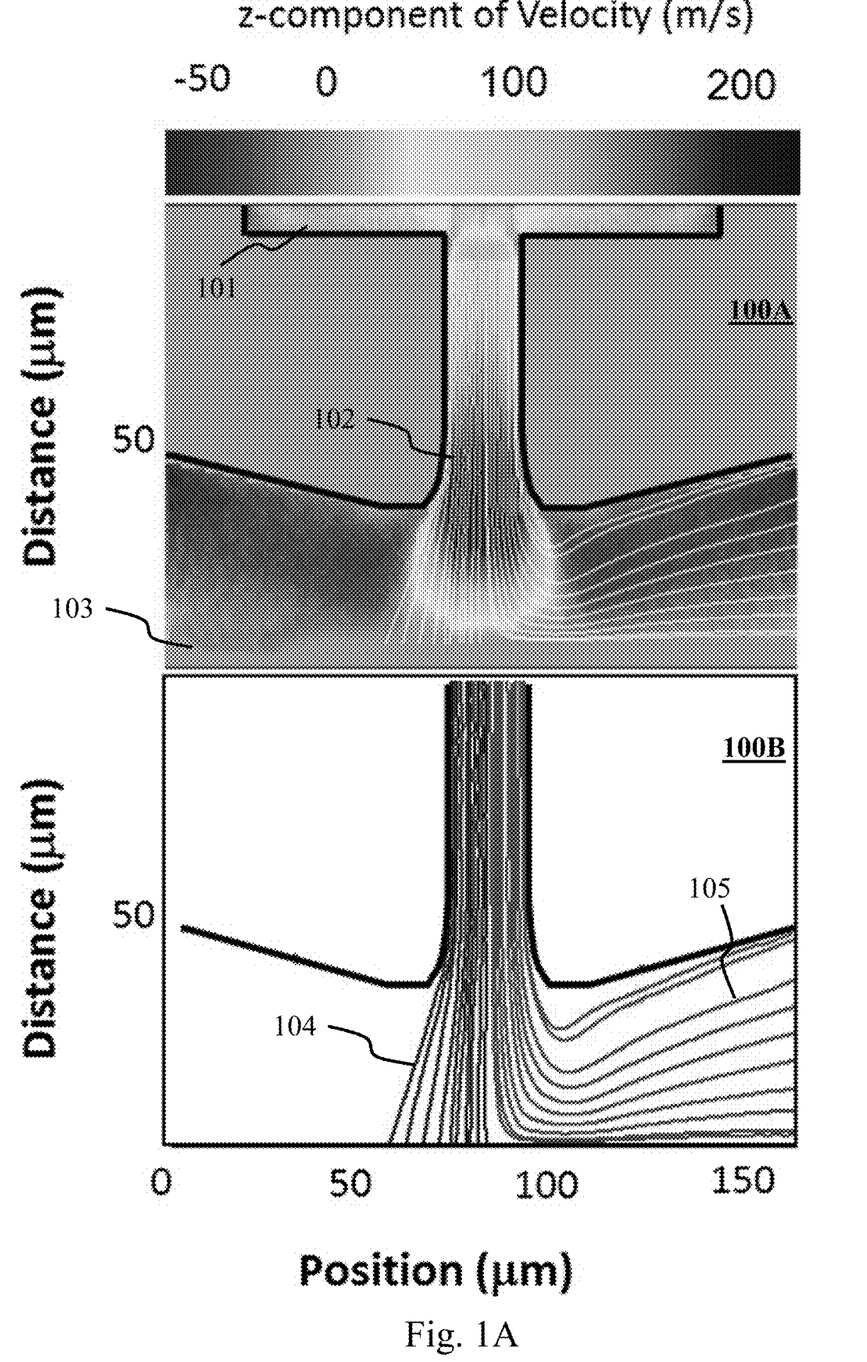
FIG. 1A is a schematic of vapor flow from an organic vapor jet printing (OVJP) nozzle.

With reference now to FIG. 1A, two graphs 100A and 100B of an OVJP flow are shown. In graph 100A, the z-component of the vapor velocity is shown based on the darkness of the flow. The nozzle 101 ejects a vapor jet 102 comprising a carrier gas and species to a substrate 103, which may be a cooled substrate. In graph 100B, the lines show molecular trajectories 104 as the species molecules are deposited onto the substrate, while the lines 105 show the trajectory of the carrier gas, which may be an inert carrier gas for example $N_2$.

Figure 1B:
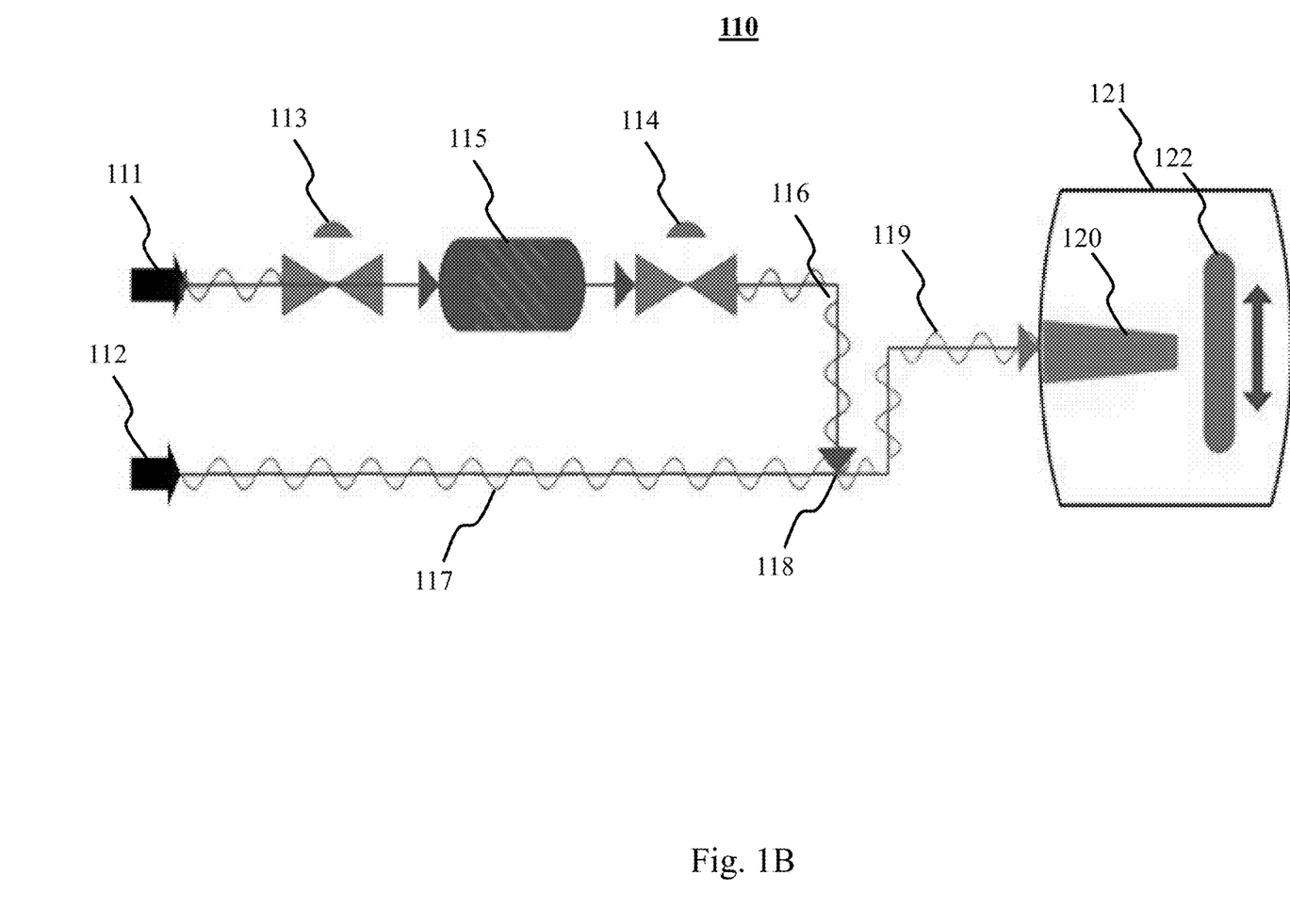
FIG. 1B is a schematic of an exemplary OVJP system.

With reference to FIG. 1B, a schematic diagram of an OVJP device 110 is shown. Two flows of carrier gas 111 and 112 enter the system, the first flow 111 passing through first optional valve 113, source 115, and second optional valve 114. The valves 113 and 114 may be any suitable valve, and may each be adjusted to control the amount of source material entering the system. Source 115 may be any suitable molecule, including but not limited to CELL-MET, thiols, etc. In various embodiments, source 115 may comprise any sublimable source material. The two flows of carrier gas form two paths—a source path 116 comprising the carrier gas and source material, and a dilution path 117 comprising the carrier gas without source material. The two paths 116 and 117 meet at point 118 and mix in mixing region 119 before exiting through nozzle 120 into deposition chamber 121, in which substrate 122 is positioned. The nozzle 120 in diagram 110 creates a high-speed vapor jet. In one embodiment disclosed herein, the nozzle 120 further comprises a shutter (not shown), for example a Microelectromechanical Systems (MEMS) shutter. The addition of a shutter to the OVJP allows for massive and high speed parallel printing. In some embodiments, a system may comprise multiple nozzles and/or multiple shutters. As shown in the diagram, substrate 122 may be movable in order to allow for printing multiple elements from the same nozzle, and to control where the elements print on the substrate.

Figure 2A:
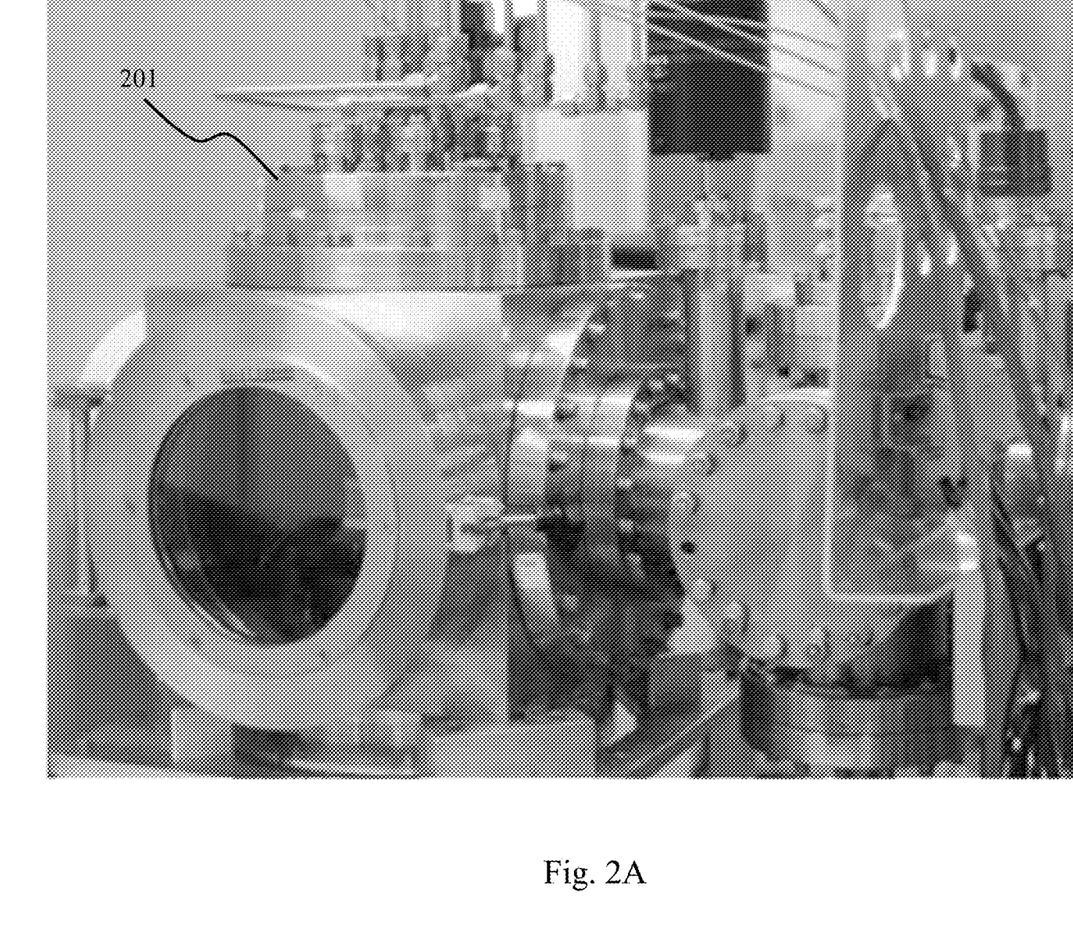
FIG. 2A is a photograph of an exemplary OVJP system.

With reference to FIG. 2A, a photograph of an exemplary OVJP system is shown. The diagram shown in FIG. 2B is an internal view of part of the system, the top of which is denoted in FIG. 2A as 201, positioned in a vacuum chamber in the depicted embodiment.

Figure 2B:
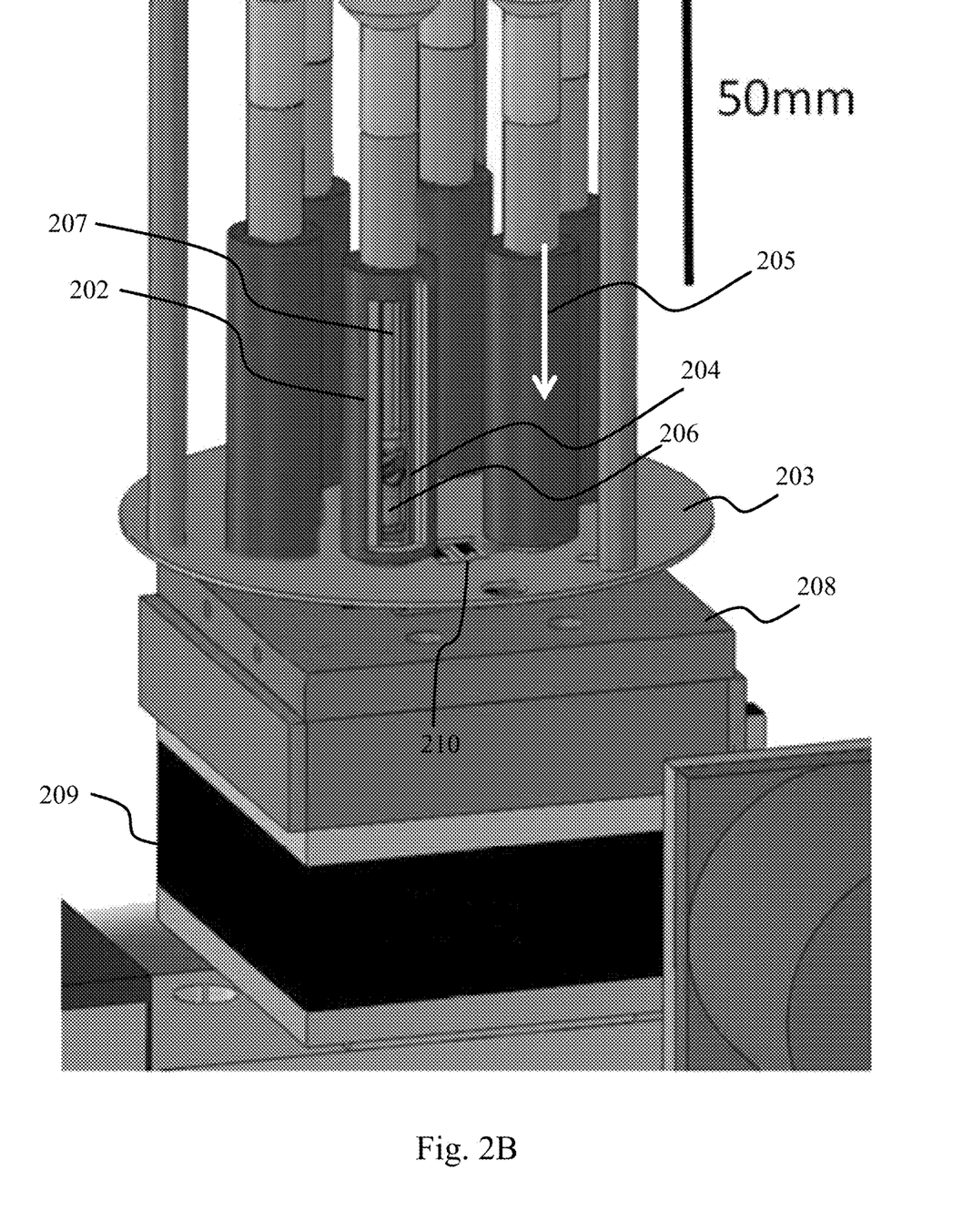
FIG. 2B is a cut away schematic of an OVJP nozzle.

With reference to FIG. 2B, an internal diagram of an exemplary OVJP system is shown. The depicted system includes heater 202 with a cutaway view inside showing rod 207, vent 204, and material chamber 206. The direction of gas flow is downward toward manifold 203, as shown by arrow 205. The manifold comprises one or more print heads, with print head 210 shown in cutaway view. Positioned below the manifold 203 is substrate holder 208, which may in some embodiments be chilled. The substrate holder 208 is positioned on stage 209.

As shown in the exemplary OVJP diagram of FIG. 2B, an OVJP may comprise multiple gas sources in fluid communication with a single manifold, where each gas source is independently heated by a heater 202. The manifold may in turn comprise multiple print heads, with any given print head in fluid communication with one or more gas sources. The OVJP system may further comprise a glove box loading system, and may be configured for minimal pressure drops and tube lengths.

Figure 3A:
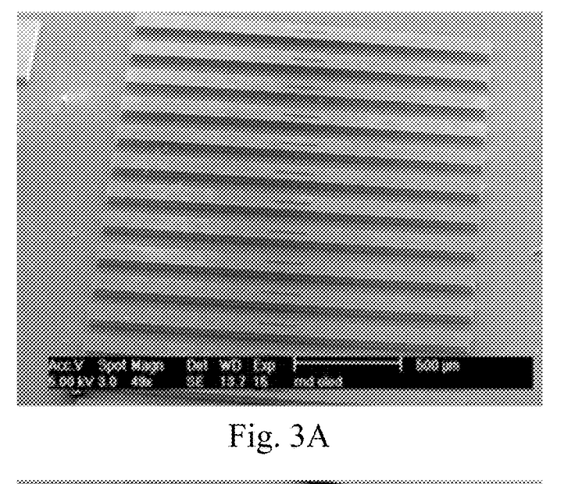
FIG. 3A is a schematic of an exemplary nozzle head configuration and corresponding printing resolution diagram.
Figure 3B:
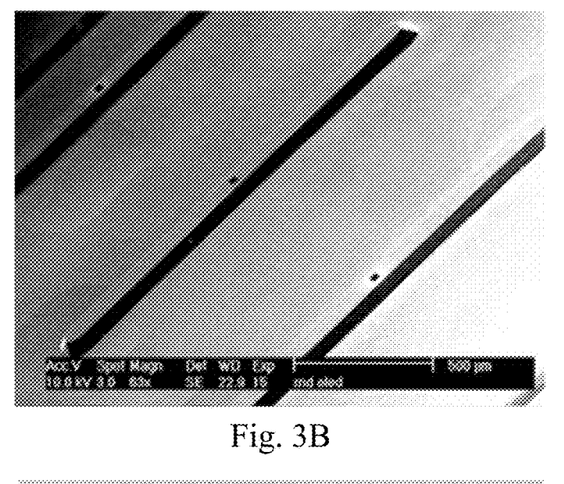
FIG. 3B is a schematic of an exemplary nozzle head configuration and corresponding printing resolution diagram.
Figure 3C:
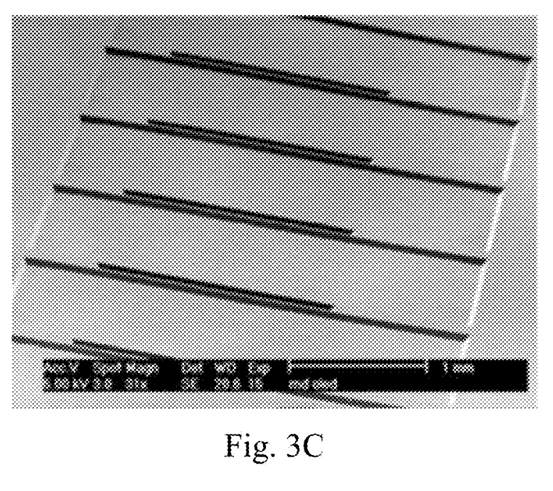
FIG. 3C is a schematic of an exemplary nozzle head configuration and corresponding printing resolution diagram.
Figure 3D:
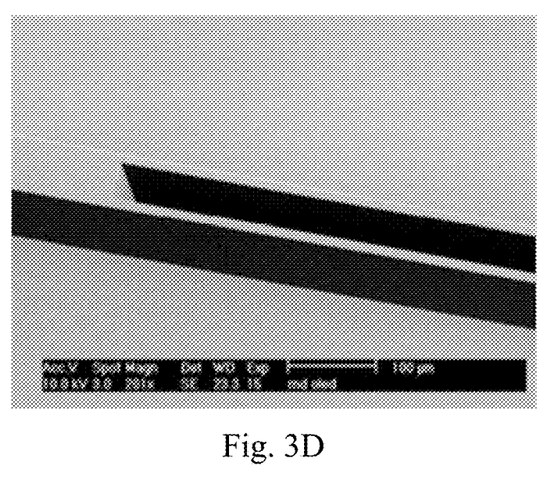
FIG. 3D is a schematic of an exemplary nozzle head configuration and corresponding printing resolution diagram.

With reference now to FIGS. 3A-3D, a set of images of various MEMS nozzle arrays are shown. The various nozzles are additionally described with reference to FIG. 3E. The nozzle array of FIG. 3A is a converging-relieved (C-R) nozzle array produced by deep-reactive ion etching (DRIE). A diagram of an exemplary C-R nozzle is shown in image 302 of FIG. 3E. The nozzle array of FIG. 3B is a converging-tapered (C-T) nozzle array produced by ethylene diamine pyrochatechol (EDP) etching. A diagram of an exemplary C-T nozzle is shown in image 303 of FIG. 3E. The nozzle arrays of FIG. 3C and FIG. 3D comprise converging-diverging (C-D) nozzles produced by EDP etching, a diagram of which is shown in image 304 of FIG. 3E. The diagrams 301-304 of FIG. 3E are depicted as exemplary nozzle structures to show angles and proportions of one exemplary embodiment of a nozzle, and are not meant to be drawn to scale or limiting in any way.

Figure 3E:
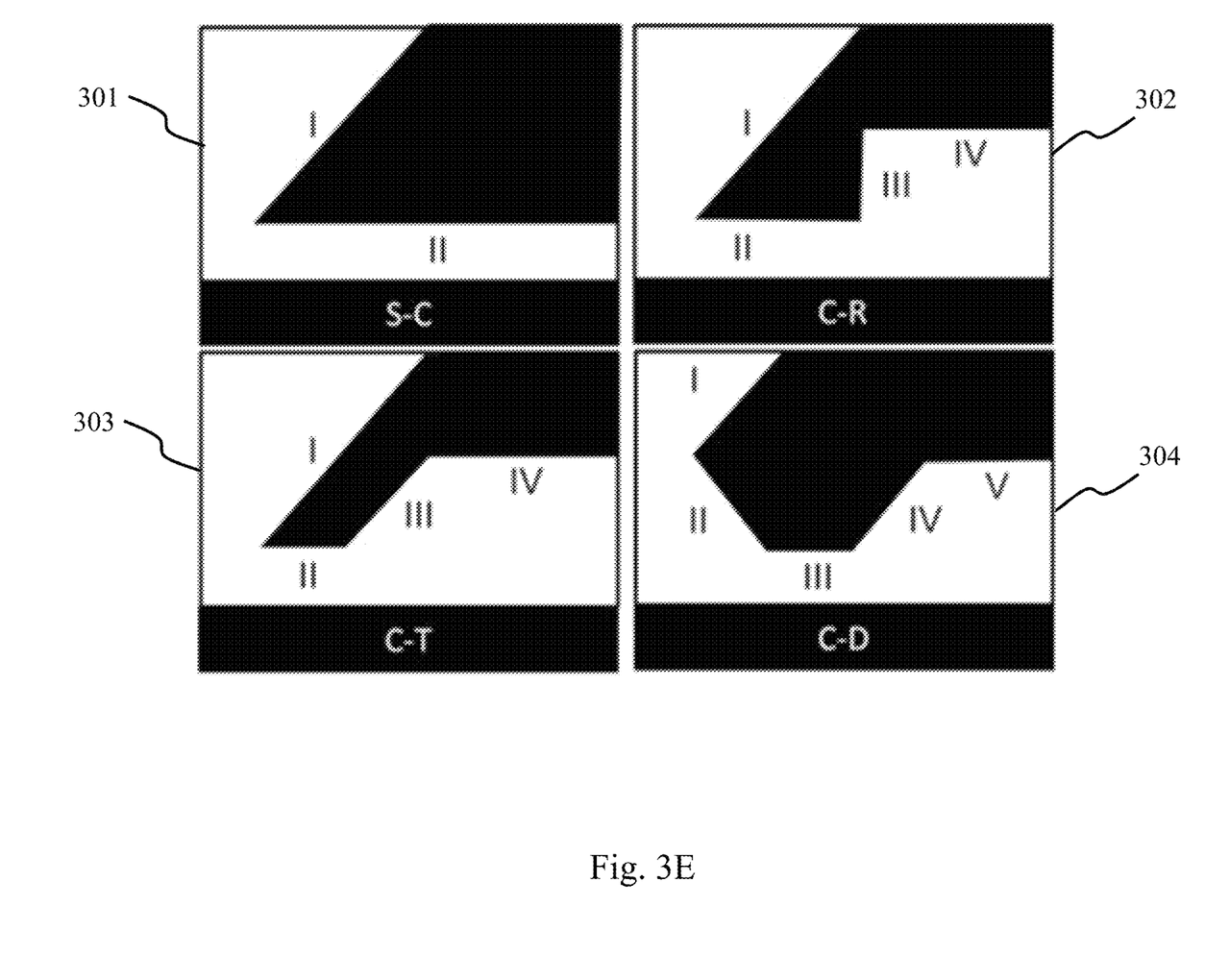
FIG. 3E is a section view of various nozzle configurations.

As shown in FIG. 3E, a simple converging (S-C) nozzle 301 includes two defining surfaces I and II positioned at an acute angle with respect to one another. A C-R nozzle 302 includes four defining surfaces I-IV, where surface II is positioned at an acute angle with respect to surface I, surface III is positioned at a right angle with respect to surface II, and surface IV is positioned at a right angle with respect to surface III, substantially parallel to surface II. A C-T nozzle 303 includes four defining surfaces I-IV, with surface II positioned at an acute angle with respect to surface I, surface III positioned at an obtuse angle with respect to surface II substantially parallel to surface I, and surface IV positioned at an obtuse angle with respect to surface III, substantially parallel to surface II. Finally, a C-D nozzle 304 includes five defining surfaces I-V, with surface II positioned at an approximately right angle with respect to surface I, surface III positioned at an obtuse angle with respect to surface II, surface IV positioned at an obtuse angle to surface III, substantially parallel to surface I, and surface V positioned at an obtuse angle with respect to surface IV, substantially parallel to surface III.

Figure 4:
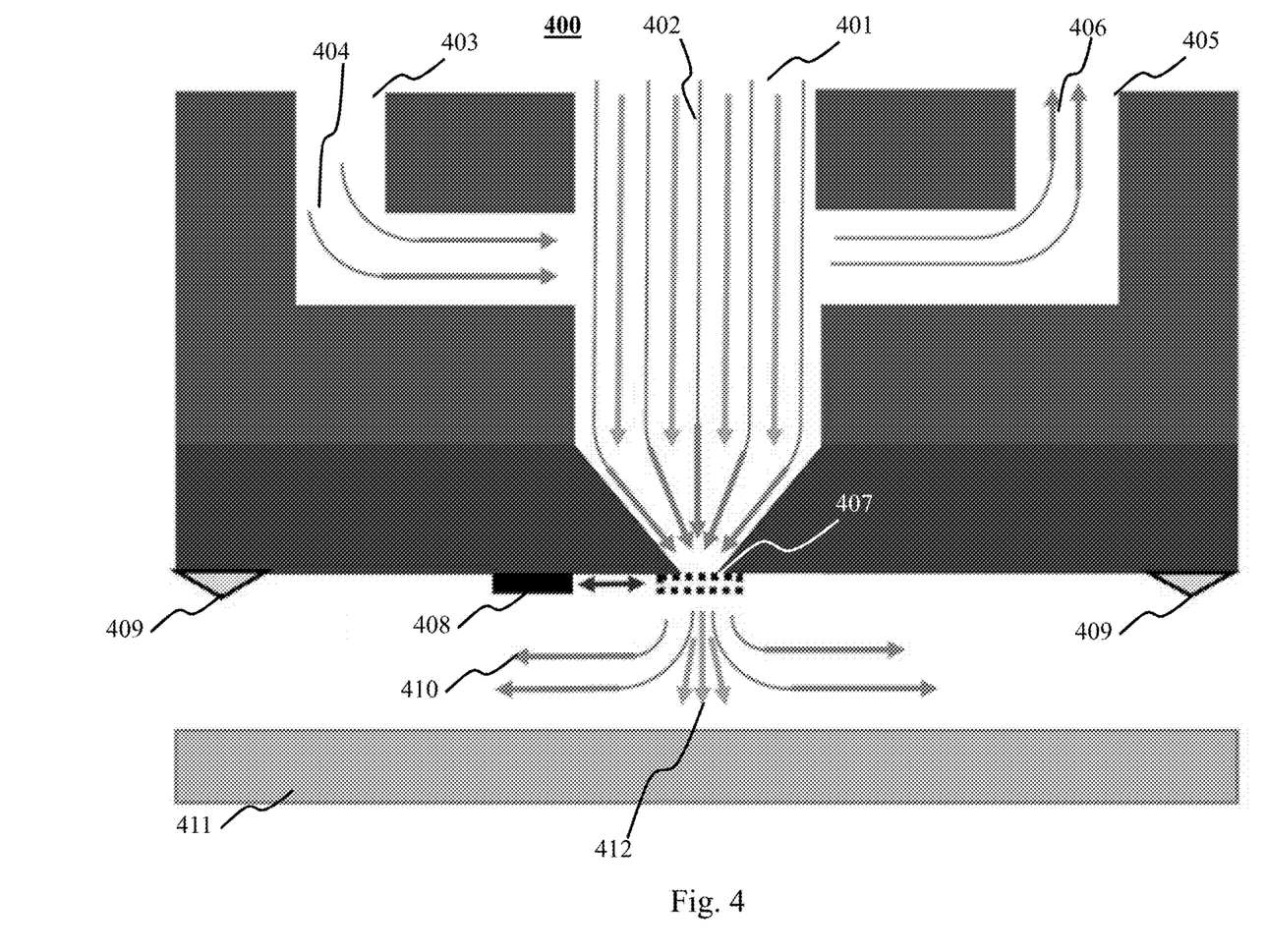
FIG. 4 is a schematic on an OVJP nozzle with an MEMS shutter.

With reference to FIG. 4, an exemplary print head 400 is shown. Print head 400 includes three channels—the source channel 401, dilution channel 403, and exhaust channel 405, the three channels directing source flow 402, dilution flow 404, and exhaust flow 406, respectively. The source flow 402 comprises carrier gas and source molecules, while dilution flow 404 comprises carrier gas and is configured to adjustably dilute the source flow 402. The exhaust flow 406 is configured to adjustably channel excess carrier gas from the source flow 402.

The print head 400 is configured to propel an adjustable quantity of source molecules and carrier gas through nozzle 407, which in some embodiments is a MEMS nozzle. The print head 400 further comprises a shutter 408, which may be a MEMS shutter, and which is configured to open and close the outlet of the nozzle 407 in response to one or more electronic control signals. When the shutter 408 is open, carrier gas and source molecules flow freely toward the substrate 411, where the source molecules 412 are deposited on the substrate while the carrier gas 410 flows away from the nozzle. Optional optical sensors 409 are configured to measure characteristics of source molecule deposition, for example the shape of the deposited feature, and may provide feedback for a control system for one or more valves in fluid communication with channels 401, 403, and 405, and/or for the MEMS shutter 408.

As disclosed herein, flows of gases may be provided from any suitable source, including compressed tanks of gas or the like. In one embodiment, a device may comprise multiple print heads as shown in FIG. 4, with each print head having a dilution channel and an exhaust channel, and wherein some or all of the dilution channels are in fluid communication with one another, and/or wherein some or all of the exhaust channels are in fluid communication with one another.

Figure 5:
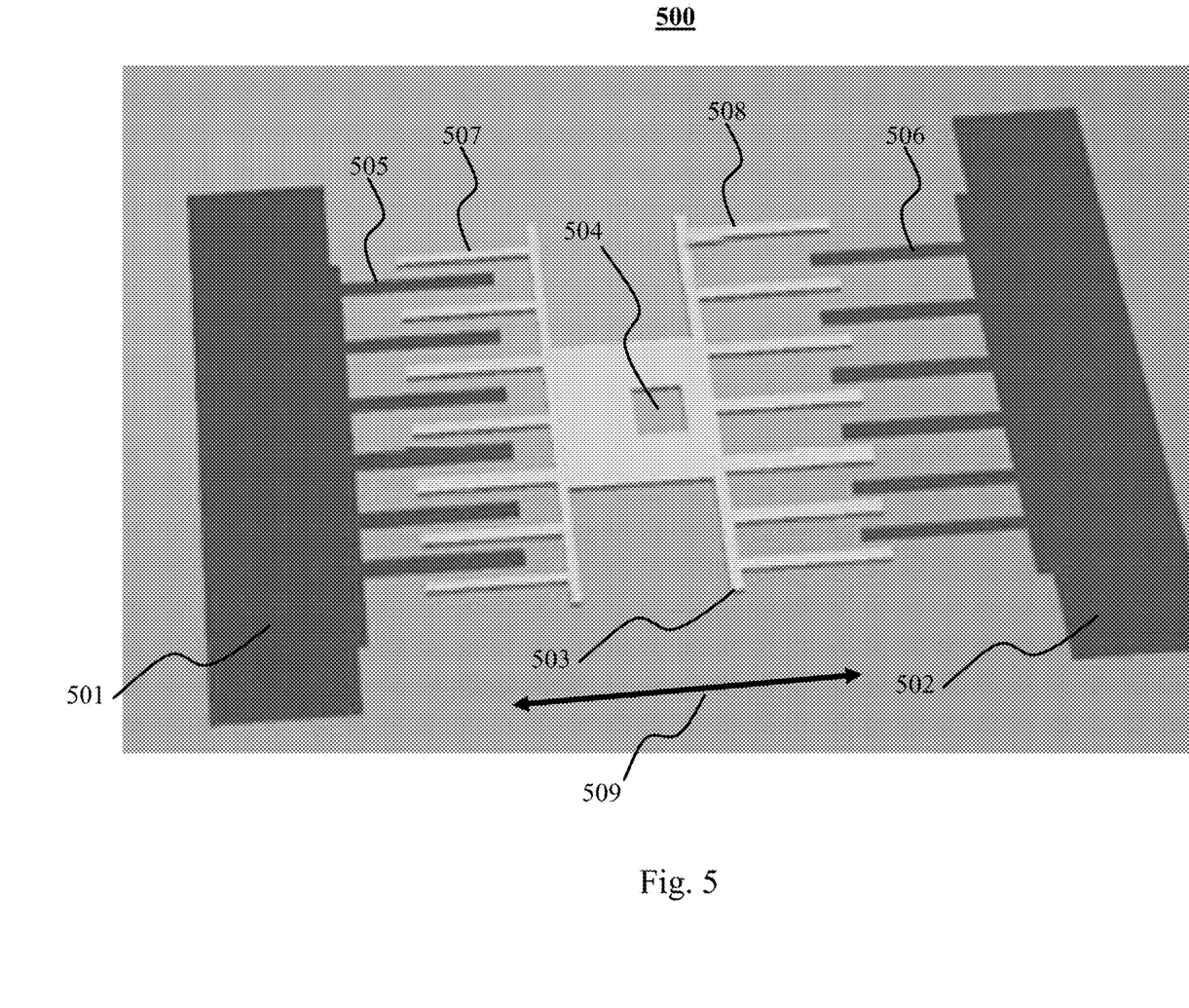
FIG. 5 is a diagram of an exemplary MEMS shutter.

An exemplary MEMS shutter 500 is shown in FIG. 5. Shutter 500 includes two opposing fixed electrodes 501 and 502, and movable electrode 503. Fixed electrodes 501 and 502 each include a plurality of tines 505 and 506, which control the movement of movable electrode 503 along axis 509 by exerting an electrostatic force on the corresponding tines 507 and 508 on movable electrode 503. In the depicted embodiment, movable electrode 503 is charged with an amount of charge in a first polarity, while fixed electrodes 501 and 502 are each charged with an amount of charge in opposite polarities from one another, for example being held at a given potential with respect to one another. When the polarity of the charge on the first fixed electrode 501 is opposite to the polarity of the charge of the movable electrode 503, the movable electrode 503 moves toward the fixed electrode 501. When the polarity of the charge on the second fixed electrode 502 is opposite to the polarity of the charge on the movable electrode 503, the movable electrode 503 moves toward the second fixed electrode 502.

In the depicted embodiment, the movable electrode 503 further comprises an aperture 504, which is configured to allow some or all flow of material from a nozzle when in an open position. In a closed position, the nozzle is not in fluid communication with the aperture 504, and flow is therefore obstructed. When the print head of FIG. 4 is obstructed by a shutter like the one in FIG. 5, the remaining gas in the print head is expelled from the exhaust channel 405.

In one aspect, an organic vapor jet nozzle comprises a nozzle head, the nozzle head comprising one or more channels for organic material flow, wherein one or more of the channels includes a conical shape head that leads to an aperture, wherein one or more of the channels includes an inlet for the introduction of a carrier gas, and an outlet to exhaust a portion of the carrier gas from the channel, and a shutter in proximate relation to the aperture.

In one embodiment, the shutter is a MEMS shutter that comprises a first fixed electrode and an opposite second fixed electrode, and a third movable electrode positioned between the first and the second electrode, wherein the third electrode includes an aperture and a closure portion and functions as the shutter. In some embodiments, the shutter is electrostatically actuated.

An embodiment of the disclosed subject matter provides a nozzle assembly including at least one nozzle having a first aperture formed along an edge of a first aperture plate to eject a carrier gas flow laden with condensable organic vapor onto a substrate in a deposition chamber, one or more second apertures formed on a second aperture plate disposed adjacent to the first aperture to form a vacuum aperture, where the first aperture plate and the second aperture plate are separated by a first separator plate, one or more third apertures formed on a third aperture plate to eject purge gas that are disposed adjacent to the second aperture plate, where the second aperture plate and the third aperture plate are separated by second separator plate, and a third separator plate disposed adjacent to the one or more third aperture plates to form a gas channel in the one or more third aperture plates.

An embodiment of the disclosed subject matter provides an OLED device made by a nozzle assembly including at least one nozzle having a first aperture formed along an edge of a first aperture plate to eject a carrier gas flow laden with condensable organic vapor onto a substrate in a deposition chamber, one or more second apertures formed on a second aperture plate disposed adjacent to the first aperture to form a vacuum aperture, where the first aperture plate and the second aperture plate are separated by a first separator plate, one or more third apertures formed on a third aperture plate to eject purge gas that are disposed adjacent to the second aperture plate, where the second aperture plate and the third aperture plate are separated by second separator plate, and a third separator plate disposed adjacent to the one or more third aperture plates to form a gas channel in the one or more third aperture plates.

An embodiment of the disclosed subject matter provides a deposition system comprising an isolated chamber in which deposition is performed using at least one nozzle having a first aperture formed along an edge of a first aperture plate to eject a carrier gas flow laden with condensable organic vapor onto a substrate in a deposition chamber, one or more second apertures formed on a second aperture plate disposed adjacent to the first aperture to form a vacuum aperture, where the first aperture plate and the second aperture plate are separated by a first separator plate, one or more third apertures formed on a third aperture plate to eject purge gas that are disposed adjacent to the second aperture plate, where the second aperture plate and the third aperture plate are separated by second separator plate, and a third separator plate disposed adjacent to the one or more third aperture plates to form a gas channel in the one or more third aperture plates.

An embodiment of the disclosed subject matter provides a nozzle assembly including at least one nozzle having a first delivery aperture formed along an edge of a first delivery aperture plate to eject a carrier gas flow laden with condensable organic vapor onto a substrate in a deposition chamber, the first delivery aperture plate having a first side and a second side, a first separator plate disposed on the first side of the first delivery aperture plate, and a second separator plate disposed on the second side of the first delivery aperture plate, a second delivery aperture formed along an edge of a second delivery aperture plate to eject a carrier gas flow laden with condensable organic vapor onto the substrate in the deposition chamber, where the second delivery aperture plate is disposed adjacent to the first separator plate on a side opposite to the first delivery aperture plate, and a third delivery aperture formed along an edge of a third delivery aperture plate to eject a carrier gas flow laden with condensable organic vapor onto the substrate in the deposition chamber, where the third delivery aperture plate is disposed adjacent to the second separator plate on a side opposite to the first delivery aperture plate.

An embodiment of the disclosed subject matter provides a nozzle assembly includes at least one nozzle having a first aperture formed along an edge of a first aperture plate to eject a carrier gas flow laden with condensable organic vapor onto a substrate in a deposition chamber, one or more second apertures each formed on second aperture plates disposed adjacent to and on opposite sides of the first aperture to form a vacuum aperture, where the first aperture plate and the second aperture plates are separated by first separator plates, and second separator plates disposed adjacent to the second aperture plates, on an opposite side from the first separator plates.

An embodiment of the disclosed subject matter provides a nozzle assembly including at least one nozzle having a first aperture formed along an edge of a first aperture plate to eject a carrier gas flow laden with condensable organic vapor onto a substrate in a deposition chamber, one or more second apertures each formed on second aperture plates disposed adjacent to and on opposite sides of the first aperture to form a vacuum aperture, where the first aperture plate and the second aperture plates are separated by first separator plates, second separator plates disposed adjacent to the second aperture plates, on an opposite side from the first separator plates, and one or more third apertures each formed on third aperture plates respectively disposed adjacent to each of the second separator plates, opposite the second aperture plates, where confinement flow gas is directed through the one or more third apertures from a source external to the deposition chamber.

An embodiment of the disclosed subject matter provides a nozzle assembly including at least one nozzle having a first aperture formed along an edge of a first aperture plate to eject a carrier gas flow laden with condensable organic vapor onto a substrate in a deposition chamber, one or more second apertures each formed on second aperture plates disposed adjacent to and on opposite sides of the first aperture to form a vacuum aperture, where the first aperture plate and the second aperture plates are separated by first separator plates, second separator plates disposed adjacent to the second aperture plates, on an opposite side from the first separator plates, and third separator plates respectively disposed adjacent to each of the second separator plates opposite the second aperture plates, where the third separator plates are configured to define a roof of a channel for confinement gas to flow.

According to an embodiment, a first device comprising a first organic light emitting device is also provided. The first organic light emitting device can include an anode, a cathode, and an organic layer, disposed between the anode and the cathode. The organic layer can be deposited using a device including a first aperture plate to eject a carrier gas flow laden with condensable organic vapor onto a substrate in a deposition chamber, one or more second apertures formed on a second aperture plate disposed adjacent to the first aperture to form a vacuum aperture, where the first aperture plate and the second aperture plate are separated by a first separator plate, one or more third apertures formed on a third aperture plate to eject purge gas that are disposed adjacent to the second aperture plate, where the second aperture plate and the third aperture plate are separated by second separator plate, and a third separator plate disposed adjacent to the one or more third aperture plates to form a gas channel in the one or more third aperture plates. The first device can be a consumer product, an organic light-emitting device, and/or a lighting panel.

The nozzle aperture can be bifurcated or otherwise divided by a channel separator to include multiple apertures (e.g., multiple delivery channels). The delivery channel that is divided by the channel separator can improve the uniformity of organic material flux onto the substrate within the deposition zone. For example, without bifurcation, e.g., without the presence of the channel separator, a raised or rounded deposition profile may result. In contrast, when the nozzle is bifurcated, the blocking material in the center of the nozzle may prevent material from depositing in the middle of the deposition area, leading to a flatter, "plateau" type deposition profile. More generally, a nozzle as disclosed herein may include multiple apertures.

Nozzles as disclosed herein may be oriented vertically, i.e., positioned such that the axis of the delivery channel is perpendicular to a substrate on which material ejected by the nozzle is to be deposited. Alternatively or in addition, one or more nozzles may be positioned at an angle relative to the substrate, such as an angle between 0° and 90°.

A nozzle block as disclosed herein may include multiple delivery apertures and/or multiple exhaust channels, which may be disposed in any suitable arrangement within the nozzle block. For example, multiple delivery apertures may be disposed within a nozzle block, with exhaust channels disposed between adjacent nozzles. When multiple nozzles are used within a single nozzle block, they may be disposed in any suitable arrangement, such as a linear, staggered, or layered arrangement. Each arrangement of nozzles may be used to perform different ordered or simultaneous deposition. For example, in a linear arrangement, each nozzle may deposit a different layer over a single substrate that is moved past each nozzle in the linear arrangement in turn.

Figure 6:
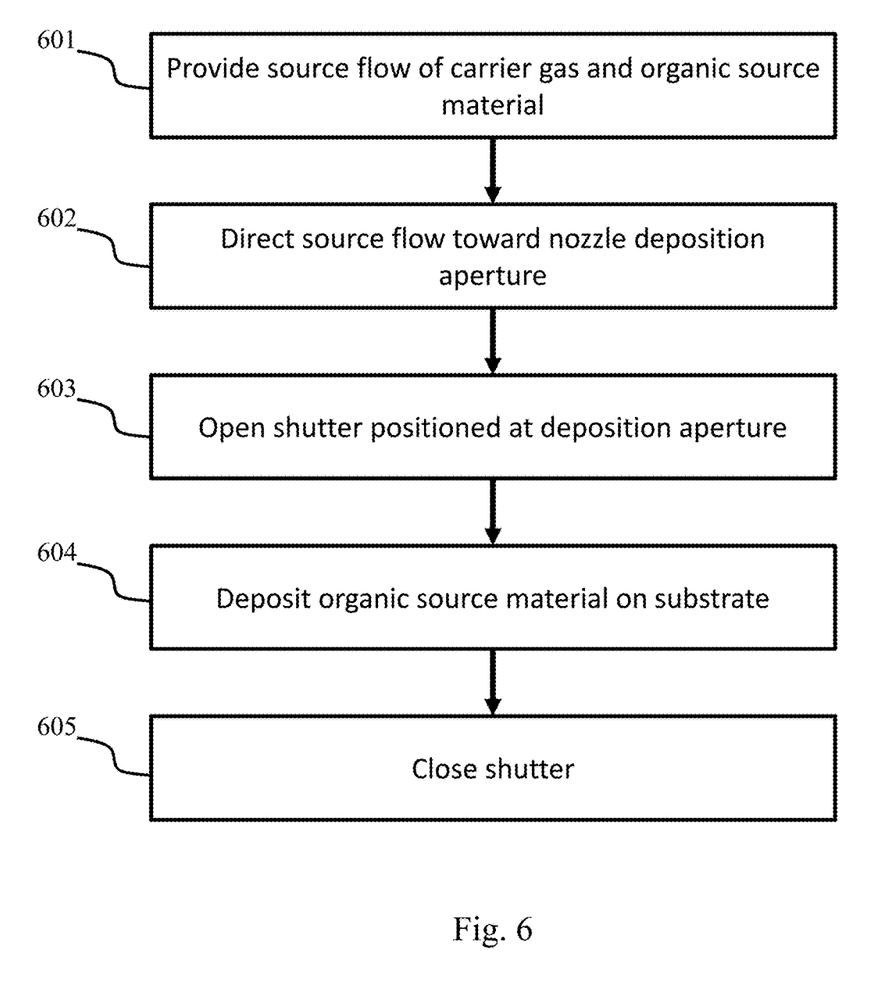
FIG. 6 is a method of forming an organic feature on a substrate.

Also disclosed herein are methods of forming a device, for example an OLED display or OLED device, using any embodiment of the devices disclosed herein. In one exemplary embodiment, shown in FIG. 6, a method of forming an organic feature on a substrate includes the steps of providing a source flow comprising a carrier gas and an organic source material into a source channel in step 601, directing the source flow toward a nozzle having a deposition aperture in fluid communication with the source channel in step 602, opening a shutter positioned at the deposition aperture, thereby directing a vapor jet of the source flow toward a substrate in step 603, depositing a quantity of organic source material on the substrate in step 604, and closing the shutter, obstructing the vapor jet in step 605.

The shutter may in some embodiments be a MEMS shutter, and a method may comprise the step of sending a control signal to the MEMS shutter to open or close the MEMS shutter. Methods may include steps of evaluating a deposition pattern and adjusting one or more parameters of a print head based on one or more evaluated characteristics of the deposition pattern. In one exemplary embodiment, the reflected intensity of the deposition pattern is evaluated using one or more optical sensors, and based on the measurements from the sensors one or more parameters may be adjusted in order to influence future deposition patterns. Exemplary parameters include, but are not limited to, flow speed of the carrier gas, composition of the carrier gas, degrees of opening of one or more valves, for example valves in fluid communication with a source flow, a dilution flow, and/or an exhaust flow, the opening duration of a shutter, distance between the nozzle and the substrate, or any other suitable parameter.

In some embodiments, a method may include the steps of providing additional carrier gas from a dilution channel in fluid communication with the source channel, wherein the dilution channel flows into the source channel at an angle with respect to the source flow. In some embodiments, this angle is about 90 degrees. In other embodiments, a method may include providing an exhaust channel, configured to allow the source flow to flow out of the exhaust channel when the shutter is in a closed position.

In some embodiments, a MEMS shutter may be actuated to be partially open and partially closed. In some embodiments, this may be accomplished by having more than two fixed electrodes at different positions. In some embodiments, a MEMS shutter may be effectively actuated to be partially opened and partially closed using pulse-width modulation (PWM).

The disclosure is also directed to a method of forming a device, the method comprising forming a line or spot of an organic material on a substrate, wherein the forming includes activating a shutter, providing an organic vapor jet nozzle in connection with an organic material source, providing an organic material in its vapor state, and providing a carrier gas, wherein the jet nozzle comprises one or more channels for the vapor flow of the organic material, wherein one or more of the channels includes a conical shape head that leads to an aperture, wherein each of the one or more channels includes an inlet for the introduction of the carrier gas, and an outlet to exhaust a portion of the carrier gas from the channel; and the shutter is in proximate relation to the aperture, wherein the line or spot of the formed organic material is printed to the substrate when the shutter is in an open position, and the organic vapor and the carrier gas that is in the channel is vented through the outlet when the shutter is in the closed position.

An embodiment of the disclosed subject matter provides a method of manufacturing a nozzle assembly having at least one nozzle, the method including forming a first aperture along an edge of a first aperture plate to eject a carrier gas flow laden with condensable organic vapor onto a substrate in a deposition chamber, forming one or more second apertures on a second aperture plate disposed adjacent to the first aperture to form a vacuum aperture, where the first aperture plate and the second aperture plate are separated by a first separator plate, forming one or more third apertures on a third aperture plate to eject purge gas that are disposed adjacent to the second aperture plate, where the second aperture plate and the third aperture plate are separated by second separator plate, and disposing a third separator plate adjacent to the one or more third aperture plates to form a gas channel in the one or more third aperture plates.

An embodiment of the disclosed subject matter provides a method of fabricating a nozzle includes forming a first aperture along an edge of a first aperture plate to eject a carrier gas flow laden with condensable organic vapor onto a substrate in a deposition chamber, forming one or more second apertures on a second aperture plate disposed adjacent to the first aperture to form a vacuum aperture, where the first aperture plate and the second aperture plate are separated by a first separator plate, forming one or more third apertures on a third aperture plate to eject purge gas that are disposed adjacent to the second aperture plate, where the second aperture plate and the third aperture plate are separated by second separator plate, and disposing a third separator plate adjacent to the one or more third aperture plates to form a gas channel in the one or more third aperture plates.

To increase the deposition rate of a nozzle assembly, the flow of carrier gas saturated with organic vapor can be increased, and/or the amount of organic material in the carrier gas can be increased by increasing the evaporator temperature and/or increasing the area of one or more nozzles. Increasing the flow rate may impact the shape of the deposition, potentially increasing the deposition width and limiting printing resolution. Increasing the evaporator temperature to increase carrier saturation may cause thermal degradation to the organic molecules. Increasing the area of the nozzle can only be done in one dimension as not to affect the printing width, and this dimension is limited to the silicon (Si) wafer thickness in micro-machined silicon devices. Related U.S. application Ser. No. 14/643,887, incorporated by reference herein, discloses a fabrication process using MEMS techniques and silicon wafers.

Some OLED structures and similar devices may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the disclosure can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the disclosure can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, microdisplays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present disclosure, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

An OLED fabricated using devices and techniques disclosed herein may have one or more characteristics selected from the group consisting of being flexible, being rollable, being foldable, being stretchable, and being curved, and may be transparent or semi-transparent. In some embodiments, the OLED further comprises a layer comprising carbon nanotubes.

In some embodiments, an OLED fabricated using devices and techniques disclosed herein further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

An OLED fabricated according to techniques and devices disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The materials, structures, and techniques described herein may have applications in devices other than the fabrication of OLEDs. For example, other optoelectronic devices such as organic solar cells and organic photodetectors may employ the materials and structures. More generally, organic devices, such as organic transistors, may employ the materials and structures.

In some embodiments of an emissive region, the emissive region further comprises a host.

In some embodiments, a compound as described herein can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The organic layer can also include a host. In some embodiments, two or more hosts are preferred. In some embodiments, the hosts used may be a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL

A hole injecting/transporting material to be used in the present disclosure is not particularly limited, and any compound may be used as long as the compound is typically used as a hole injecting/transporting material.

EBL

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host

The light emitting layer of the organic EL device of the present disclosure preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

As previously disclosed, OLEDs and other similar devices may be fabricated using a variety of techniques and devices. For example, in OVJP and similar techniques, one or more jets of material is directed at a substrate to form the various layers of the OLED.

It is understood that the various embodiments described herein are by way of example only, and are not intended to limit the scope of the disclosure. For example, many of the materials and structures described herein may be substituted with other materials and structures without deviating from the spirit of the disclosure. The present disclosure as claimed may therefore include variations from the particular examples and preferred embodiments described herein, as will be apparent to one of skill in the art. It is understood that various theories as to why the disclosure works are not intended to be limiting.

We claim:

1. An organic vapor deposition device, comprising:
   a print head, comprising:
      a source channel, in fluid communication with a flow of carrier gas and a quantity of organic source material configured to mix with the carrier gas;
      a nozzle having a deposition outlet, in fluid communication with the source channel; and
      a MEMS shutter configured at least to open and close the deposition outlet,
   wherein the MEMS shutter is electrostatically actuated;
   wherein the print head is configured to allow the flow of carrier gas and the organic source material exit the deposition outlet when the MEMS shutter is in an open position, and to prevent the flow of carrier gas and the organic source material from exiting the deposition outlet when the MEMS shutter is in a closed position.

2. The organic vapor deposition device of claim 1, wherein the MEMS shutter comprises:
   first and second fixed electrodes; and
   a third movable electrode positioned between the first and the second electrodes, wherein the third electrode includes an aperture that is in fluid communication with the deposition outlet when the MEMS shutter is in an open position.

3. The organic vapor deposition device of claim 1, wherein the print head further comprises a dilution channel in fluid communication with the source channel, and configured to provide a dilution flow to be combined with the source flow.

4. The organic vapor deposition device of claim 1, wherein the print head further comprises an exhaust channel separate from the deposition outlet in fluid communication with the source channel.

5. The organic vapor deposition device of claim 4, wherein when the MEMS shutter is in the closed position, the source flow flows through the exhaust channel.

6. The organic vapor deposition device of claim 1, further comprising a substrate holder positioned opposite the deposition outlet, configured to position a substrate such that when the MEMS shutter is in the open position, the organic source material is deposited on the substrate.

7. The organic vapor deposition device of claim 6, further comprising at least one optical sensor configured to gather data about a deposition pattern of the deposited organic source material.

8. The organic vapor deposition device of claim 6, wherein the substrate holder is configured to move in at least two dimensions in response to control signals from a controller.

9. The organic vapor deposition device of claim 1, wherein the device comprises a plurality of print heads wherein each of the plurality of print heads is in fluid communication with a different quantity of organic source material.

10. The organic vapor deposition device of claim 1, wherein the device comprises a plurality of print heads wherein all of the plurality of print heads are in fluid communication with the same flow of carrier gas.

11. The organic vapor deposition device of claim 1, wherein the MEMS shutter is positioned at the deposition outlet.

12. An organic vapor deposition device, comprising:
   a print head, comprising:
      a source channel, in fluid communication with a flow of carrier gas and a quantity of organic source material configured to mix with the carrier gas;
      a nozzle having a deposition outlet, in fluid communication with the source channel;
      a dilution channel in fluid communication with the source channel, and configured to provide a dilution flow to be combined with the source flow; and
      a MEMS shutter configured at least to open and close the deposition outlet;
   wherein the print head is configured to allow the flow of carrier gas and the organic source material exit the deposition outlet when the MEMS shutter is in an open position, and to prevent the flow of carrier gas and the organic source material from exiting the deposition outlet when the MEMS shutter is in a closed position.

13. An organic vapor deposition device, comprising:
   a print head, comprising:
      a source channel, in fluid communication with a flow of carrier gas and a quantity of organic source material configured to mix with the carrier gas;
      a nozzle having a deposition outlet, in fluid communication with the source channel;
      an exhaust channel separate from the deposition outlet in fluid communication with the source channel; and
      a MEMS shutter configured at least to open and close the deposition outlet;
   wherein the print head is configured to allow the flow of carrier gas and the organic source material exit the deposition outlet when the MEMS shutter is in an open position, and to prevent the flow of carrier gas and the organic source material from exiting the deposition outlet when the MEMS shutter is in a closed position, and wherein when the MEMS shutter is in the closed position the source flow flows through the exhaust channel.

* * * * *